United States Patent
Huang et al.

(10) Patent No.: US 8,330,051 B2
(45) Date of Patent: Dec. 11, 2012

(54) MULTI-LAYER CIRCUIT BOARD, METHOD OF MANUFACTURING THE SAME, AND COMMUNICATION DEVICE

(75) Inventors: Mingli Huang, Shenzhen (CN); Shun Zhang, Shenzhen (CN); Xichen Yang, Shenzhen (CN); Junying Zhao, Shenzhen (CN); Bing Luo, Shenzhen (CN); Zhihai Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 237 days.

(21) Appl. No.: 12/767,634

(22) Filed: Apr. 26, 2010

(65) Prior Publication Data

US 2010/0200277 A1    Aug. 12, 2010

Related U.S. Application Data

(63) Continuation of application No. PCT/CN2009/071450, filed on Apr. 24, 2009.

(30) Foreign Application Priority Data

Sep. 28, 2008  (CN) .......................... 2008 1 0216597
Jan. 22, 2009  (CN) .......................... 2009 1 0005975

(51) Int. Cl.
   *H05K 1/00*    (2006.01)
(52) U.S. Cl. ....................... 174/252; 361/792
(58) Field of Classification Search .................. 174/252; 361/792–795
See application file for complete search history.

(56) References Cited

U.S. PATENT DOCUMENTS

| | | | |
|---|---|---|---|
| 6,205,028 B1 * | 3/2001 | Matsumura | 361/720 |
| 6,816,378 B1 * | 11/2004 | Belady et al. | 361/704 |
| 6,922,339 B2 | 7/2005 | Nakamura et al. | |
| 7,069,645 B2 * | 7/2006 | Ishikawa et al. | 29/830 |
| 2007/0272435 A1 | 11/2007 | Johnson | |
| 2007/0284711 A1 | 12/2007 | Lee et al. | |
| 2008/0158821 A1 | 7/2008 | Sandwall | |

FOREIGN PATENT DOCUMENTS

| | | |
|---|---|---|
| CN | 2534775 | 2/2003 |
| CN | 1837926 A | 9/2006 |
| CN | 101066008 A | 10/2007 |

(Continued)

OTHER PUBLICATIONS

Partial Translation of Office Action dated Aug. 11, 2010 in connection with Chinese Patent Application No. 200910005975.2.

(Continued)

*Primary Examiner* — Jeremy Norris

(57) ABSTRACT

A multi-layer circuit board, a method of manufacturing the same, and a communication device are provided. As for the multi-layer circuit board, a slot segment is opened on at least one daughter board to form a first daughter board. At least one daughter board and medium layers are stacked together. The daughter boards include first daughter boards. The first daughter boards are placed in such a way that the slot segments of the first daughter boards are communicated. The slot segments are communicated to form a receiving slot. A heat conducting block is placed within the receiving slot. Each medium layer is sandwiched between the daughter boards. The stacked daughter boards, medium layers, and heat conducting block are pressed together, and the pressed daughter boards and heat conducting block are made into a multi-layer circuit board. The heat conducting block is embedded when the circuit board is pressed, thereby simplifying the assembling process of the heat conducting block.

17 Claims, 6 Drawing Sheets

FOREIGN PATENT DOCUMENTS

| | | |
|---|---|---|
| EP | 1 261 028 A2 | 11/2002 |
| JP | 2004146140 A | 5/2004 |
| WO | WO 2004/103038 A1 | 11/2004 |

OTHER PUBLICATIONS

Partial Translation of Office Action dated Apr. 8, 2011 in connection with Chinese Patent Application No. 200910005975.2.

Written Opinion of the International Searching Authority dated Jun. 4, 2009 in connection with International Patent Application No. PCT/CN2009/071450.

Partial Translation of Office Action dated Jul. 26, 2011 in connection with Chinese Patent Application No. 200910005975.2.

Supplementary European Search Report dated Sep. 13, 2011 in connection with European Patent Application No. EP 09 81 5564.

Communication (extended European search report) dated Feb. 1, 2012 issued in conneection with European Application No. 11192345.4.

* cited by examiner

MULTI-LAYER CIRCUIT BOARD, METHOD OF MANUFACTURING THE SAME, AND COMMUNICATION DEVICE

CROSS-REFERENCE TO RELATED APPLICATIONS

This application is a continuation of International Application No. PCT/CN2009/071450, filed on Apr. 24, 2009, which claims priority to Chinese Patent Application No. 200810216597.8, filed on Sep. 28, 2008 and to Chinese Patent Application No. 200910005975.2, filed on Jan. 22, 2009, all of which are hereby incorporated by reference in their entireties.

TECHNICAL FIELD

The present invention relates to the field of an electronic communication technology, and more particularly to a multi-layer circuit board, a method of manufacturing the multi-layer circuit board, and a communication device.

BACKGROUND

With the prosperous development of the electronic industry, circuit boards have been widely used. Electronic components are usually assembled on a circuit board for performing operations, such as a power tube, a quad flat non-leaded (QFN) package, a ball grid array (BGA), a chip scale package (CSP), and a quad flat package (QFP). With the continuous increasing of the electronic components on the circuit board, a heat dissipation issue becomes more and more important.

For the electronic components with large power, currently, the heat dissipation is usually performed on such electronic components by partially embedding a metal substrate in a corresponding circuit board.

During the process of implementing the present invention, the inventor(s) found that the prior art at least has the following problems.

The partially embedded metal substrate requires being assembled independently, which increases the technical procedures and also requires an assistant technical assembly, thereby affecting the production efficiency.

SUMMARY

Accordingly, the present invention is directed to a circuit board having a heat conducting block, a method of manufacturing the circuit board, and a communication device. The heat conducting block is embedded when the circuit board is pressed, thereby simplifying an assembling process of the heat conducting block.

The embodiments of the present invention adopt the following technical solutions.

A method of manufacturing a multi-layer circuit board is provided, which includes the following steps.

A slot segment is opened on at least one daughter board to form a first daughter board.

At least one daughter board and medium layers are stacked together. The at least one daughter board includes first daughter boards. The first daughter boards are placed in such a way that the slot segments of the first daughter boards are communicated. The slot segments are communicated to form a receiving slot. A heat conducting block is placed within the receiving slot. Each medium layer is sandwiched between the daughter boards.

The stacked daughter boards, medium layers, and heat conducting block are pressed together, and then the pressed daughter boards and heat conducting block are made into a multi-layer circuit board.

A multi-layer circuit board is provided, which includes a heat conducting block, and a plurality of daughter boards and medium layers that are stacked together. The daughter boards include first daughter boards. A slot segment is opened on a first daughter board. The slot segments of the plurality of first daughter boards are communicated to form a receiving slot. The heat conducting block is placed within the receiving slot. Each medium layer is sandwiched between the daughter boards.

A communication device is provided, which includes at least one multi-layer circuit board. The multi-layer circuit board includes a heat conducting block, and a plurality of daughter boards and medium layers that are stacked together. The daughter boards include first daughter boards. A slot segment is opened on a first daughter board. The slot segments of the plurality of first daughter boards are communicated to form a receiving slot. The heat conducting block is placed within the receiving slot. Each medium layer is sandwiched between the daughter boards.

The above technical solutions of the present invention have the following advantages.

In the embodiments of the present invention, a heat conducting block is embedded when the circuit board is pressed, thereby simplifying an assembling process of the heat conducting block.

BRIEF DESCRIPTION OF THE DRAWINGS

To illustrate the technical solutions according to the embodiments of the present invention or in the prior art more clearly, the accompanying drawings required for describing the embodiments or the prior art are introduced below briefly. Apparently, the accompanying drawings in the following descriptions merely show some of the embodiments of the present invention, and persons of ordinary skill in the art can obtain other drawings according to the accompanying drawings without creative efforts.

DETAILED DESCRIPTION

The technical solutions of the embodiments of the present invention are described below clearly with reference to the accompanying drawings. Apparently, the embodiments in the following descriptions are merely part of the embodiments of the present invention, rather than all the embodiments of the present invention. Persons of ordinary skill in the art can derive other embodiments based on the embodiments of the present invention without creative efforts, which all fall within the scope of the present invention.

Figure 2:
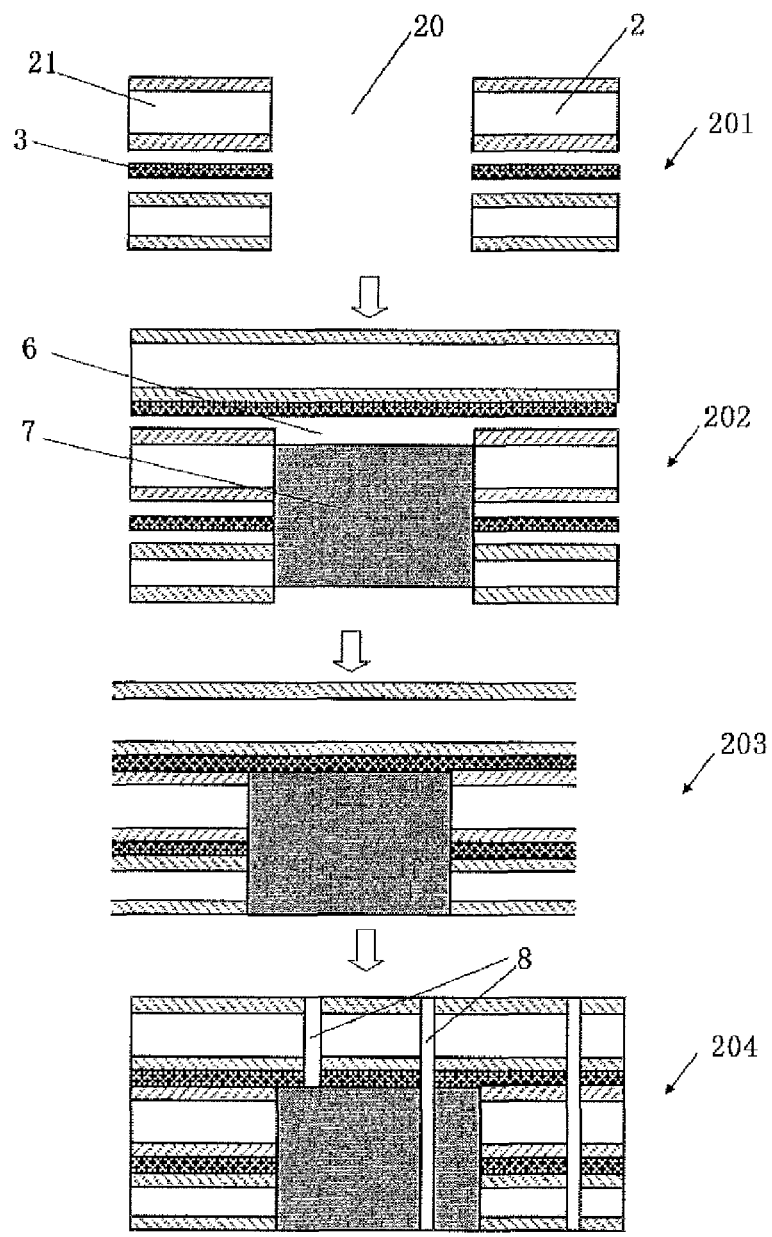
FIG. 2 is a schematic diagram of a method of manufacturing a multi-layer circuit board according to an embodiment of the present invention.
Figure 3:
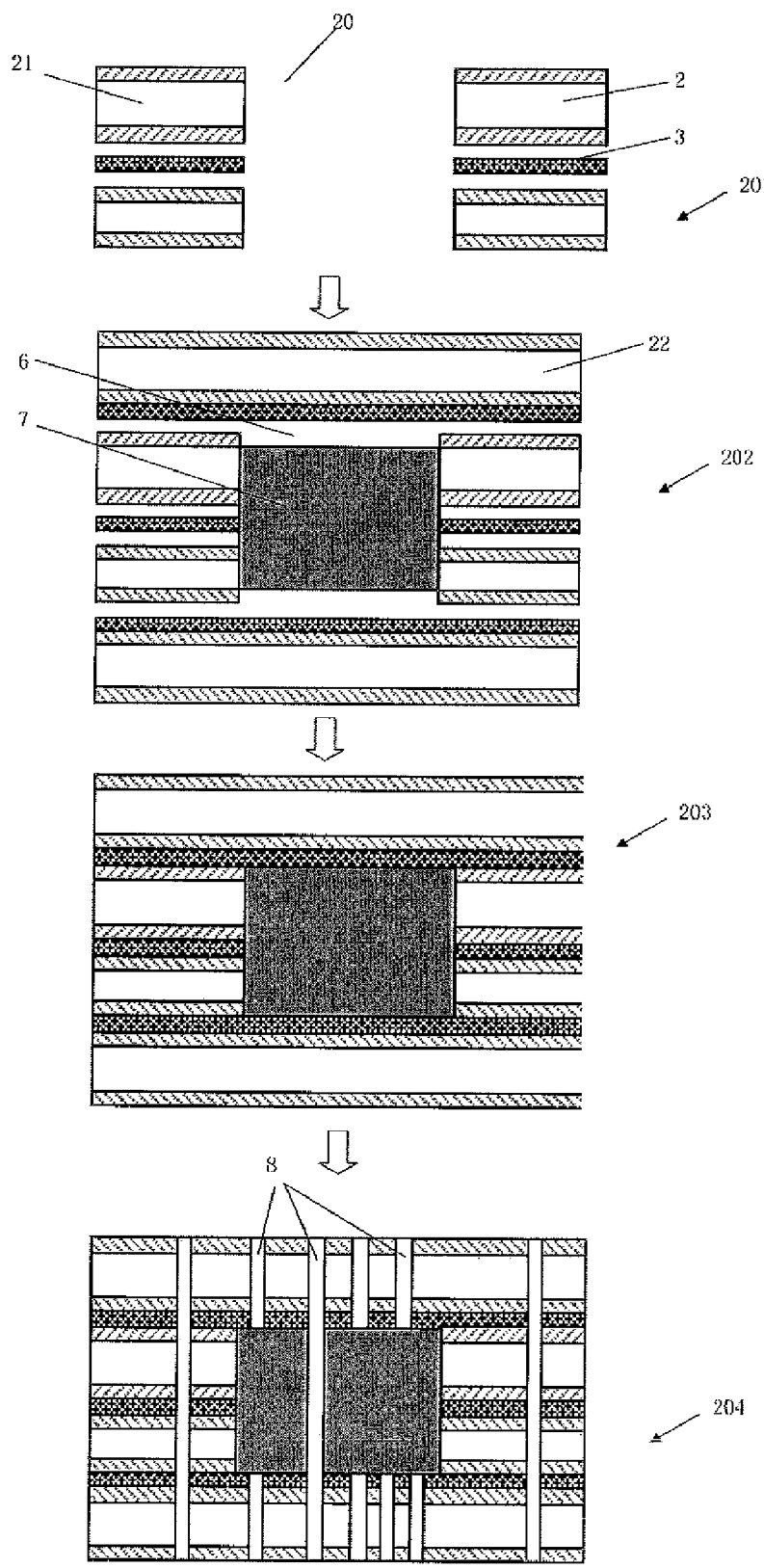
FIG. 3 is a schematic diagram of a method of manufacturing a multi-layer circuit board according to another embodiment of the present invention.
Figure 4:
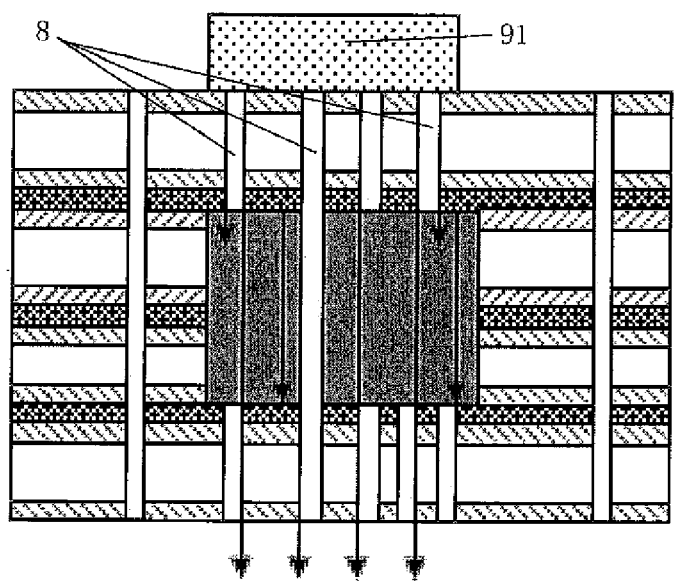
FIG. 4 is a schematic diagram of a multi-layer circuit board according to an embodiment of the present invention.

As shown in FIG. 2 or 3, in an embodiment, the present invention provides a method of manufacturing a multi-layer circuit board. The method includes the following steps.

In step 201, a slot segment 20 is opened on at least one daughter board 2 to form a first daughter board 21.

In step 202, at least one daughter board 2 and medium layers 3 are stacked together. The daughter boards 2 include first daughter boards 21. The first daughter boards 21 are placed in such a way that the slot segments 20 of the first daughter boards 21 are communicated. The slot segments 20 are communicated to form a receiving slot 6. A heat conducting block 7 is placed within the receiving slot 6. Each medium layer 3 is sandwiched between the daughter boards 2.

In step 203, the stacked daughter boards 2, medium layers 3, and heat conducting block 7 are pressed together, and then the daughter boards and the heat conducting block are made into a multi-layer circuit board.

In the embodiment of the present invention, the heat conducting block is embedded in the circuit board when the daughter boards are pressed together, so that the technical procedures are quite simple and an assembling efficiency of the heat conducting block is increased.

In the embodiment of the present invention, in step 203, after the pressing process, the heat conducting block is lower than or aligned with a surface of the circuit board, or even higher than the surface of the circuit board.

As shown in FIG. 2 to FIG. 5, in an embodiment of the present invention, the daughter boards may include a first daughter board 21 and second daughter boards 22 on which no slot segment is opened. The second daughter boards 22 are located at one end or two ends of the receiving slot 6. Under this situation, the present invention may further include step 204, in which a heat conducting via 8 connected to the heat conducting block is opened beside the heat conducting block. In addition, the heat conducting via 8 may also be drilled in other positions of the multi-layer circuit board.

As shown in FIG. 2 to FIG. 5, in the embodiment of the present invention, each medium layer being sandwiched between adjacent daughter boards can be realized as the following situations.

The medium layer 3 is sandwiched between two first daughter boards 21, and a slot segment is opened between the slot segments 20 of the two first daughter boards 21. Alternatively, the medium layer 3 is sandwiched between two second daughter boards 22. Alternatively, the medium layer 3 is sandwiched between the first daughter board 21 and the second daughter board 22. A slot segment is opened on the medium layer 3. The slot segment of the medium layer is communicated with the slot segment 20 of the first daughter board 21. Alternatively, the medium layer 3 is sandwiched between the first daughter board 21 and the second daughter board 22, and a slot segment is not opened on the medium layer 3.

Referring to FIG. 2 to FIG. 5, in an embodiment of the present invention, the heat conducting via 8 is connected to the heat conducting block 7 and an electronic component 91, or connected to the heat conducting block 7 and the surface of the circuit board, or connected to the heat conducting block 7, the electronic component 91, and the surface of the circuit board, or connected to the heat conducting block 7, the electronic component 91, and a heat dissipation component embedded inside the circuit board. The heat conducting via 8 transfers the heat of the electronic component 91 to the heat conducting block 7, or transfers the heat in the heat conducting block 7 to the surface of the circuit board, or transfers the heat of the electronic component 91 to the heat conducting block 7 and then transfers the heat in the heat conducting block 7 to the surface of the circuit board (the arrows in FIG. 4 and FIG. 5 indicate heat transferring paths), or transfers the heat of the electronic component 91 to the heat conducting block 7 and then transfers the heat in the heat conducting block 7 to the heat dissipation component.

A heat conducting block is placed inside a multi-layer circuit board, and transfers the heat generated by the electronic components within the circuit board, thus decreasing the heat resistance and increasing the local heat dissipation capability of the circuit board.

In an embodiment of the present invention, the heat conducting via may be filled through electroplating, or inserted with a conductive silver paste to increase the heat dissipation effect. Alternatively, the heat conducting via may also be filled with heat conductive liquid. The heat conductive liquid may be water, oil, silicon oil, and the like.

In an embodiment of the present invention, the heat conducting block is made of a material with heat conductivity higher than that of the circuit board medium, such as copper, aluminum, or a metal alloy. The heat conducting block may also be a cavity filled with heat conductive liquid. The heat conductive liquid may flow out through the heat conducting via.

A shape of the heat conducting block may be a regular column, ball, or cone shape, or may also be an irregular three-dimensional shape. Correspondingly, a shape of the receiving slot matches with the shape of the heat conducting block, so that the heat conducting block is placed within the receiving slot. Therefore, the heat conducting block is prevented from falling off from the receiving slot or shaking inside the receiving slot after the daughter boards and the heat conducting block are pressed together due to an excessively large size of the receiving slot. Furthermore, the heat conducting block is prevented from being damaged during the mutual pressing with the daughter boards after the daughter boards and the heat conducting block are pressed together due to an excessively small size of the receiving slot.

Figure 5:
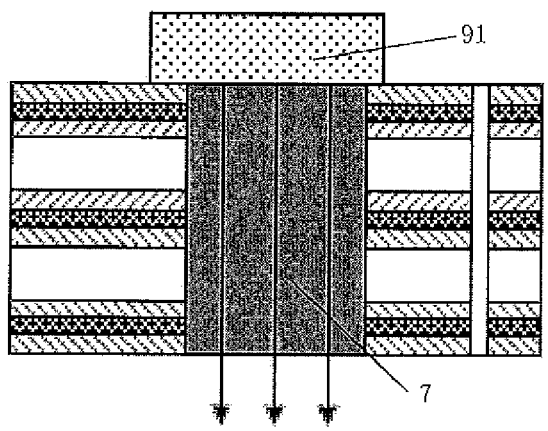
FIG. 5 is a schematic diagram of a multi-layer circuit board according to another embodiment of the present invention.

As shown in FIG. 5, in an embodiment of the present invention, all the daughter boards may be first daughter boards. After the heat conducting block 7 is placed within the receiving slot, two ends of the heat conducting block are located at external surfaces of the multi-layer circuit board. Each end face of the heat conducting block 7 is aligned with the surface of the circuit board, or higher than the surface of the circuit board, or lower than the surface of the circuit board.

In an embodiment of the present invention, the heat conducting block 7 includes a main body 71 and a connecting body 72 fixedly connected above the main body 71. A sectional area of the connecting body 72 is smaller than that of the main body 71. The shape of the receiving slot matches with the shape of the heat conducting block. The main body 71 and the connecting body 72 may be formed integrally, that is, forming an integral structure.

In an embodiment of the present invention, a sectional area of the connecting body 72 on the top of the heat conducting block 7 is relatively small. The connecting body 72 may be connected to a heat dissipation pad at the bottom of the electronic component through soldering tin. A sectional area of the main body 71 at the bottom of the heat conducting block 7 is relatively large, and the main body 71 contacts a bottom of a metal housing or a substrate of the circuit board. In other words, through embedding a step-like heat conducting block, the heat resistance is much lower than that of the heat dissipation mode by using vias, thereby sufficiently ensuring a contact area and decreasing the contact heat resistance. Moreover, the multi-layer circuit board is enabled to be assembled with components at two side surfaces thereof, so as to facilitate the component layout.

A shoulder 711 is configured at a position on the main body 71 where the connecting body 72 is correspondingly bonded. The shoulder 711 is parallel with a surface of the daughter board 21, and preferably, the shoulder 711 is located on a lower surface of the medium layer 3.

Figure 9:
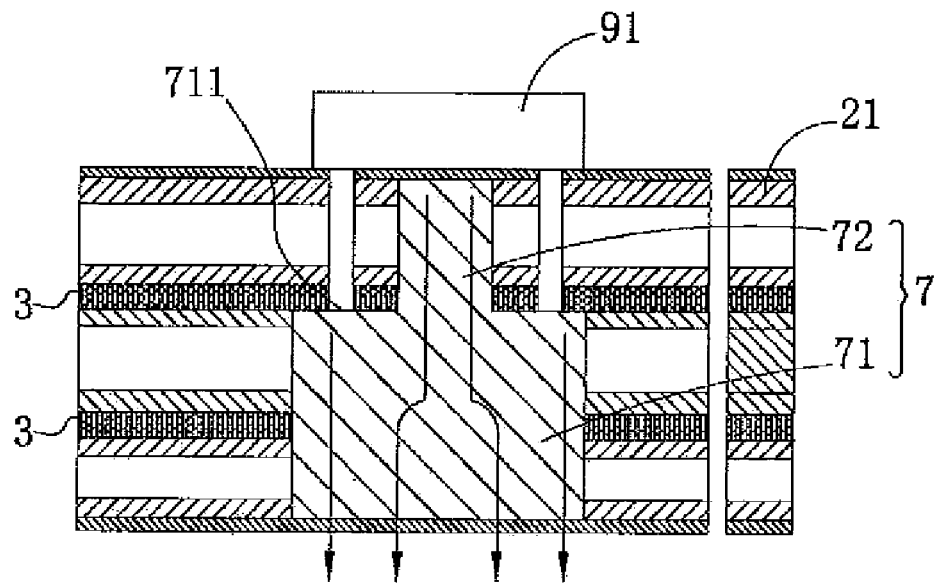
FIG. 9 is a schematic diagram of a heat conducting block of a multi-layer circuit board according to an embodiment of the present invention.
Figure 10:
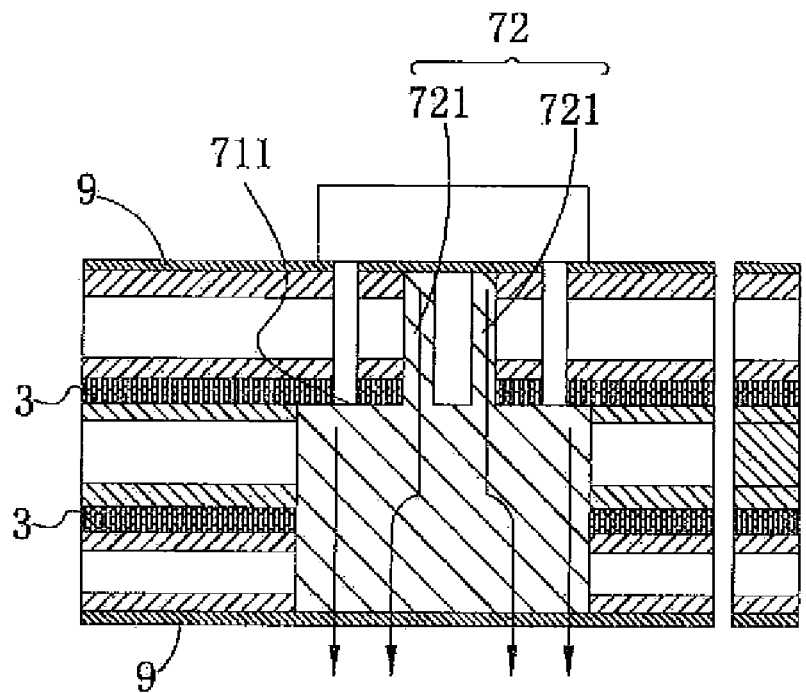
FIG. 10 is a schematic diagram of a heat conducting block of a multi-layer circuit board according to another embodiment of the present invention.
Figure 11:
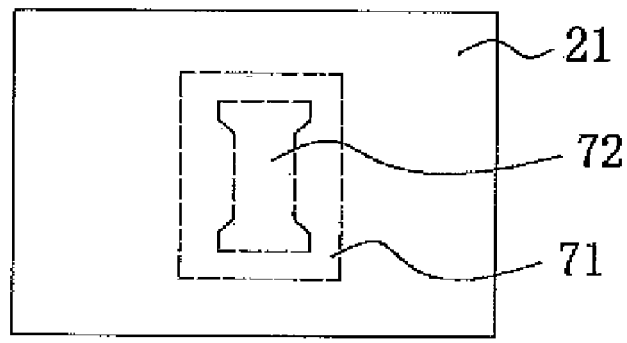
FIG. 11 is a schematic top diagram of a heat conducting block of a multi-layer circuit board according to yet another embodiment of the present invention.

The connecting body may be an integral part, as shown in FIG. 9, or may include more than two connecting sub-bodies 721. Each connecting sub-body 721 is separately placed, and is connected to the main body 71. As shown in FIG. 10, the two connecting sub-bodies 721 are fixedly connected above the main body 71 separately, in parallel, and alternately. Additionally, the connecting body 72 may be designed into any shape depending on the demand of electrical performance, including any regular or irregular shape as shown in FIG. 11. The connecting body 72 may be configured into a step-like shape depending on the actual demand, so that the heat conducting block has a plurality of steps in a height direction.

Figure 12:
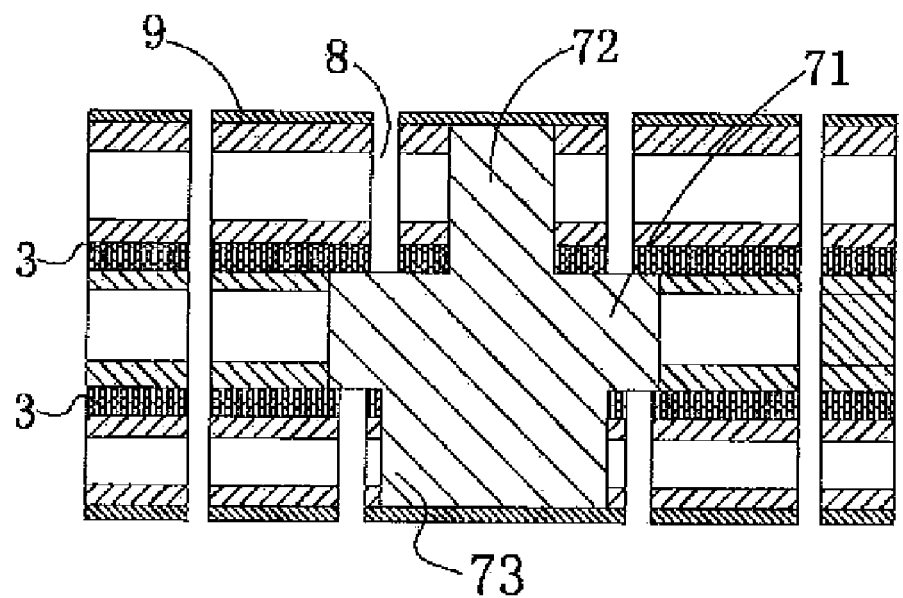
FIG. 12 is a schematic diagram of a heat conducting block of a multi-layer circuit board according to a further embodiment of the present invention.

In an embodiment of the present invention, as shown in FIG. 12, the heat conducting block 7 further includes a connecting piece 73. The connecting piece 73 is fixedly connected below the main body 71. A sectional area of the connecting piece 73 is smaller than that of the main body 71.

In an embodiment of the present invention, an electroplated layer 9 is separately placed on an upper surface and a lower surface of the multi-layer circuit board. In this case, a height of the heat conducting block is preferably equal to a height of the multi-layer circuit board, so that the heat conducting block 7 keeps contacting the two electroplated layers 9, so as to form a heat transferring channel.

Figure 6:
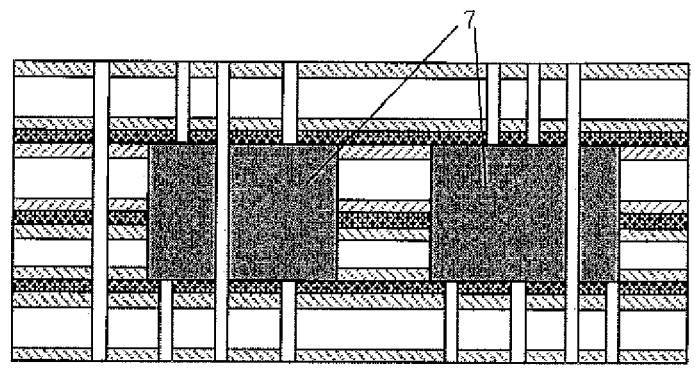
FIG. 6 is a schematic diagram of a plurality of receiving slots placed in a multi-layer circuit board according to a first embodiment of the present invention.
Figure 7:
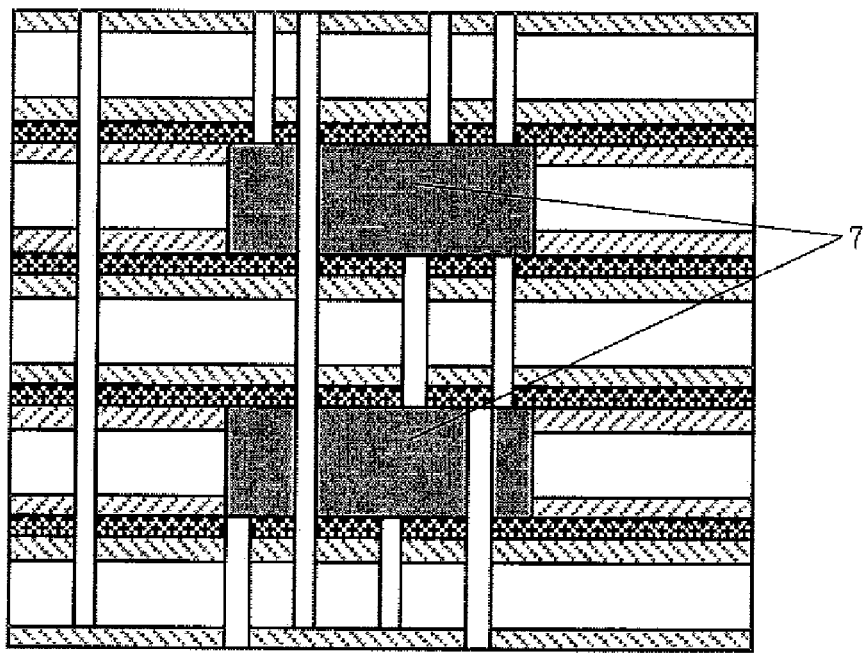
FIG. 7 is a schematic diagram of a plurality of receiving slots placed in a multi-layer circuit board according to a second embodiment of the present invention.
Figure 8:
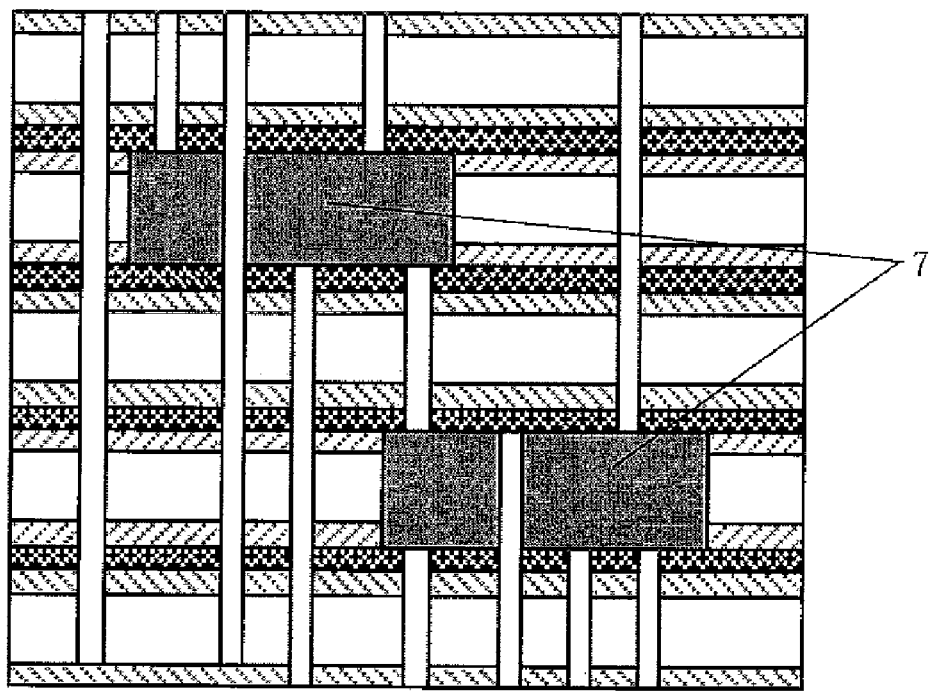
FIG. 8 is a schematic diagram of a plurality of receiving slots placed in a multi-layer circuit board according to a third embodiment of the present invention.

As shown in FIG. 6 to FIG. 8, in an embodiment of the present invention, the stacking sequence of the plurality of first daughter boards may be adjusted, or the slot segments may be opened at different positions, so that the plurality of slot segments is combined into a plurality of receiving slots 6. Alternatively, a plurality of slot segments may be opened at different positions of a first daughter board, and the plurality of slot segments is communicated with slot segments of the other first daughter boards, so as to form a plurality of receiving slots 6. A heat conducting via may be placed between the plurality of receiving slots 6.

The plurality of receiving slots 6 may be arranged side by side, or arranged vertically up and down, or staggered in an up and down direction. Sectional shapes of the slot segments of the plurality of daughter boards may be the same or different. The sectional areas thereof may be the same or different.

In an embodiment of the present invention, the medium layer may be a low-flowB-stage prepreg, or a low-flowB-stage prepreg combined with a C-stage prepreg, so that the medium layer has stretching characteristics and is capable of compensating a height error in manufacturing the heat conducting block, so as to ensure the surface flatness of the multi-layer circuit board. Definitely, the medium layer may also be another adhesive medium.

Figure 1:
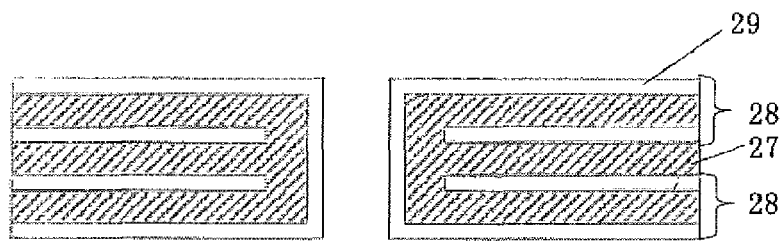
FIG. 1 is a schematic diagram of a daughter board in a method of manufacturing a multi-layer circuit board according to an embodiment of the present invention.

As shown in FIG. 1, in an embodiment of the present invention, the daughter board may be formed by at least one core material 28. In the situation that the daughter board has a plurality of core materials 28, the plurality of core materials 28 is pressed together. A medium layer 27 is filled between adjacent core materials 28. A pattern layer 29 may be further placed at an external side of the plurality of core materials 28. The medium layer 27 is filled between the pattern layer 29 and the corresponding core material 28.

In an embodiment of the present invention, an outer layer of the daughter board may be a core material or a separate pattern layer. As the daughter board is adapted to form a multi-layer circuit board, a daughter board located at an outmost layer of the multi-layer circuit board may only have a pattern layer on an inward side surface. It should be noted that, the pattern layer on the inward side surface of the daughter board may be a separate pattern layer or a pattern layer of a core material. The daughter board at the outmost layer of the multi-layer circuit board may have or not have a pattern layer on an outward side surface thereof. It should be noted that, the pattern layer on the outward side surface of the daughter board may be a separate pattern layer or a pattern layer of a core material.

Those of ordinary skill in the art should understand that, all or a part of processes in the method according to the embodiments may be accomplished by relevant hardware under instructions of a computer program. The program may be stored in a computer-readable storage medium. When the program is executed, the flow of the method according to the embodiments of the present invention is performed. The storage medium may be a magnetic disk, an optical disk, a read-only memory (ROM), a random access memory (RAM), and the like.

According to the embodiment, as shown in FIG. 2 or 3, the present invention further provides a multi-layer circuit board, which includes a heat conducting block 7 and a plurality of daughter boards 2 and medium layers 3 that are stacked together. The daughter boards 2 include first daughter boards 21. Slot segments 20 are opened on the first daughter boards 21. The slot segments 20 of the plurality of first daughter boards 21 are communicated to form a receiving slot 6. The heat conducting block 7 is placed within the receiving slot 6. Each medium layer 3 is sandwiched between the daughter boards 2.

In an embodiment of the present invention, the heat conducting block is placed inside the multi-layer circuit board, and the heat generated by electronic components is transferred within the circuit board through the heat conducting block, so that the heat resistance is decreased and the local heat dissipation capability of the circuit board is increased.

In the embodiment of the present invention, the heat conducting block is lower than or aligned with a surface of the circuit board, or even higher than the surface of the circuit board.

Based on the above embodiments, as shown in FIG. 2 or 3, the present invention further provides a communication device, which includes at least one multi-layer circuit board.

The multi-layer circuit board includes a heat conducting block 7 and a plurality of daughter boards 2 and medium layers 3 that are stacked together. The daughter boards 2 include first daughter boards 21. Slot segments 20 are opened on the first daughter boards 21. The slot segments 20 of the plurality of first daughter boards 21 are communicated to form a receiving slot 6. The heat conducting block 7 is placed within the receiving slot 6. Each medium layer 3 is sandwiched between the daughter boards 2.

In the embodiments of the present invention, the heat conducting block is placed inside the multi-layer circuit board, and the heat generated by electronic components is transferred within the circuit board through the heat conducting block, so that the heat resistance is decreased and the local heat dissipation capability of the circuit board is increased.

Only several embodiments of the present invention have been illustrated above. Those skilled in the art can make various modifications and variations to the present invention according to the disclosure of the application document without departing from the spirit and scope of the present invention.

What is claimed is:

1. A method for manufacturing a multi-layer circuit board, the method comprising:
   opening a slot segment on at least one daughter board to form a first daughter board;
   stacking at least one daughter board and medium layers, wherein the at least one daughter board comprises first daughter boards, the first daughter boards are placed in such a way that the slot segments of the first daughter boards are communicated, the slot segments are communicated to form a receiving slot, a heat conducting block is placed within the receiving slot, and each medium layer is sandwiched between the daughter boards;
   pressing the stacked daughter boards, medium layers, and heat conducting block; and
   making a multi-layer circuit board by using the pressed daughter boards and heat conducting block;
   wherein the at least one daughter board further comprises a least one second daughter board located at one end or two ends of the receiving slot, a heat conducting via which is defined within the multi-layer circuit board beside the heat conducting block and connected to the heat conducting block.

2. The method according to claim 1, wherein the heat conducting via is connected to the heat conducting block and an electronic component on the circuit board, or connected to the heat conducting block and the surface of the circuit board, or connected to the heat conducting block, an electronic component on the circuit board, and the surface of the circuit board, or connected to the heat conducting block, the electronic component on the circuit board, and a heat dissipation component embedded inside the circuit board.

3. The method according to claim 1, wherein all the daughter boards are first daughter boards, after the heat conducting block is placed within the receiving slot, two ends of the heat conducting block are located at external surface of the multi-layer circuit board.

4. The method according to claim 1, wherein the heat conducting block comprises a main body and a connecting body fixedly connected above the main body, a sectional area of the connecting body is smaller than a sectional area of the main body, the shape of the receiving slot matches with the shape of the heat conducting block.

5. The method according to claim 4, wherein the connecting body is an integral part, or comprises more than two connecting sub-bodies.

6. The method according to claim 5, wherein the heat conducting block further comprises a connecting piece, the connecting piece is fixedly connected below the main body, a sectional area of the connecting piece is smaller than a sectional area of the main body.

7. The method according to claim 1, the heat conducting block is made of a material with heat conductivity higher than heat conductivity of the circuit board, or the heat conducting block is a cavity filled with heat conductive liquid.

8. A multi-layer circuit board comprising:
   a heat conducting block; and
   a plurality of daughter boards and medium layers that are stacked together, wherein the daughter boards comprise first daughter boards, a slot segment is opened on a first daughter board, the slot segments of the plurality of first daughter boards are communicated to form a receiving slot, the heat conducting block is placed within the receiving slot, and each medium layer is sandwiched between the daughter boards;
   wherein the daughter boards further comprise a least one second daughter board located at one end or two ends of the receiving slot, a heat conducting via which is defined within the multi-layer circuit board beside the heat conducting block and connected to the heat conducting block.

9. The multi-layer circuit board according to claim 8, wherein the heat conducting via is connected to the heat conducting block and an electronic component on the circuit board, or connected to the heat conducting block and the surface of the circuit board, or connected to the heat conducting block, an electronic component on the circuit board, and the surface of the circuit board, or connected to the heat conducting block, the electronic component on the circuit board, and a heat dissipation component embedded inside the circuit board.

10. The multi-layer circuit board according to claim 8, wherein all the daughter boards are first daughter boards, after the heat conducting block is placed within the receiving slot, two ends of the heat conducting block are located at external surface of the multi-layer circuit board.

11. The multi-layer circuit board according to claim 8, wherein the heat conducting block comprises a main body and a connecting body fixedly connected above the main body, a sectional area of the connecting body is smaller than a sectional area of the main body, the shape of the receiving slot matches with the shape of the heat conducting block.

12. The multi-layer circuit board according to claim 11, wherein the connecting body is an integral part, or comprises more than two connecting sub-bodies.

13. The multi-layer circuit board according to claim 12, wherein the heat conducting block further comprises a connecting piece, the connecting piece is fixedly connected below the main body, a sectional area of the connecting piece is smaller than a sectional area of the main body.

14. The multi-layer circuit board according to claim 8, the heat conducting block is made of a material with heat conductivity higher than heat conductivity of the circuit board, or the heat conducting block is a cavity filled with heat conductive liquid.

15. The multi-layer circuit board according to claim 8, wherein the heat conducting via and the heat conducting block are filled with heat conductive liquid and in intercommunication with each other to enable heat conductive liquid of the heat conducting block to flow out through the heat conducting via.

16. A communication device, comprising:
at least one multi-layer circuit board, wherein the multi-layer circuit board comprises,
a heat conducting block, and
a plurality of daughter boards and medium layers that are stacked together, the daughter boards comprise first daughter boards, a slot segment is opened on the first daughter board, the slot segments of the plurality of first daughter boards are communicated to form a receiving slot, the heat conducting block is placed within the receiving slot, each medium layer is sandwiched between the daughter boards;
wherein the daughter boards further comprise a least one second daughter board located at one end or two ends of the receiving slot, a heat conducting via which is defined within the multi-layer circuit board beside the heat conducting block and connected to the heat conducting block.

17. The communication device according to claim 16, wherein the heat conducting block comprises a main body and a connecting body fixedly connected above the main body, a sectional area of the connecting body is smaller than a sectional area of the main body, the shape of the receiving slot matches with the shape of the heat conducting block.

* * * * *